United States Patent [19]

Chen et al.

[11] Patent Number: 5,770,507
[45] Date of Patent: Jun. 23, 1998

[54] METHOD FOR FORMING A GATE-SIDE AIR-GAP STRUCTURE IN A SALICIDE PROCESS

[75] Inventors: Chun-Cho Chen, Taipei; Gene Jiing-Chiang Chang, Hsinchu Hsien, both of Taiwan

[73] Assignee: Winbond Electronics Corp., Hsinchu, Taiwan

[21] Appl. No.: 785,782

[22] Filed: Jan. 21, 1997

[30] Foreign Application Priority Data

Nov. 9, 1996 [TW] Taiwan ................................. 85113683

[51] Int. Cl.⁶ ...................... H01L 21/283; H01L 21/336
[52] U.S. Cl. ......................... 438/305; 438/586; 438/664; 438/683
[58] Field of Search .................................... 438/233, 303, 438/305, 586, 595, 655, 664, 683, 757, 196, 204, 360

[56] References Cited

U.S. PATENT DOCUMENTS

| | | | |
|---|---|---|---|
| 4,638,347 | 1/1987 | Iyer | 257/386 |
| 4,735,680 | 4/1988 | Yen | 438/586 |
| 4,885,259 | 12/1989 | Osinski et al. | 438/586 |
| 5,330,925 | 7/1994 | Lee et al. | 438/305 |

*Primary Examiner*—T. N. Quach
*Attorney, Agent, or Firm*—Ladas & Parry

[57] ABSTRACT

A method for forming a gate-side air-gap structure in a salicide process for preventing bridging, which starts on a semiconductor wafer with active region defined completely by field oxide, includes the steps: depositing sequentially a thin oxide layer, a polysilicon layer, and a first layer over the wafer; patterning the first layer, the polysilicon layer, and the thin oxide layer to form a stack gate which consists of first layer and a gate, wherein the gate consists of the polysilicon layer and the thin oxide layer; forming lightly-doped drains beside the stack gate in the active region; forming a second layer on the sidewall of the stack gate; forming a spacer on the sidewall of the second layer; forming source and drain regions; removing the first layer and the second layer to reveal the gate, wherein air gaps exist between the gate and the spacer; depositing a titanium layer over the wafer; heating the titanium layer to form $TiSi_2$ layers on the gate, the drain region, and the source region; removing the titanium layer remaining intact over the air gaps, the spacer, and the field oxide; and heating the $TiSi_2$ layer over the wafer.

9 Claims, 6 Drawing Sheets

METHOD FOR FORMING A GATE-SIDE AIR-GAP STRUCTURE IN A SALICIDE PROCESS

BACKGROUND OF THE INVENTION

1. Field of the Invention

The present invention relates to a salicide process, particularly relates to a method for forming a gate-side air-gap structure in a salicide process to prevent bridging.

2. Description of Related Art

Because of the increasing complexity of electronic devices, the dimensions of MOS devices are shrinking, and the source (drain) resistance is increasing to the level of the channel. In order to lower the source (drain) resistance and keep the shallow junction between the metal and MOS intact, the self-aligned silicide process is widely applied in fabricating VLSI under 0.5 μm. Such a process is also called a salicide process.

Titanium, Ti, is a good oxygen-getting metal. Under adequate temperature, titanium easily reacts with silicon to form a compound called $TiSi_2$ with lower resistance by inter-diffusion. Thus, there is good ohmic contact formed between the interface of titanium and silicon. In the present salicide process, titanium is the most popular metal used for the process (Co and Pt are alternatives). FIGS. 1A through 1E illustrate, in cross section, the process according to the conventional salicide process.

Referring to the FIG. 1A, a basic MOS structure is formed on a semiconductor substrate 10. The MOS structure includes a defined polysilicon gate 12, a thin gate oxide 16, source/drain active regions 14, spacers 20 formed by chemical vapor deposition (CVD), and field oxide 22. After cleaning the wafer in a hydrofluoric acid solution to remove all possible contamination, titanium is sputtered, for example by DC magnetron sputtering, to deposit a titanium layer 30 of a thickness between 200 and 1000 Å over the MOS structure, as shown in FIG. 1B.

Then, the first rapid thermal process, RTP, is done at between 65020 and 700° C. and with a nitrogen gas ($N_2$) ambient. During the annealing step, titanium reacts with the polysilicon on the gate 12 and the crystalline silicon of the source/drain active regions and forms $TiSi_2$(C-49 phase) layers 31, however, the titanium on the spacer 20 and the field oxide 22 remain intact, as FIG. 1C illustrates.

Next, selective etching involving two consecutive wet etchings is used to remove the intact titanium layers. The first etching utilizes a mixture of $NH_4OH$, $H_2O_2$, and $H_2O$ as the etchant, while the second etching utilizes a mixture of $H_2SO_4$ and $H_2O_2$ as the etchant. The wet etching dissolves the titanium layer 30 but does not attack the $TiSi_2$ layers 31. All the titanium layers 30 on field oxide 22 and spacer 20 are removed, while the $TiSi_2$ layers are still left on the polysilicon gate 12 and the source/drain active regions 14, as FIG. 1D illustrates.

Then, the second RTP is done at about 800° C., with a pressure 760 mtorr and with a nitrogen gas ($N_2$) ambient. During the annealing step, the $TiSi_2$ layers 31 of C-49 phase are transformed to the $TiSi_2$ layers 32 of C-54 phase, as FIG. 1E illustrates. However, the salicide process according to the prior art has the disadvantages described as follows.

In the titanium salicide process, after HF cleaning, titanium is deposited on wafer in a sputter system. During the first RTP, silicon in the poly gate and source/drain area diffuses into titanium layer and reacts with titanium to form C49-$TiSi_2$. However, if excess silicon diffuses across the spacer region to form silicide (here is $TiSi_2$) on top of the spacer, which cannot be removed by selective etching, consequently the gate and drain/source area become "bridged" together, resulting in a circuit short. As devices become smaller, the spacer width needs to be reduced correspondingly such that the distance between the poly gate and source/drain decreases and thus the possibility of bridging increases.

During the second RTP, the C49-$TiSi_2$ with high resistivity (about 60 Ω.cm) is converted to C54-$TiSi_2$ with low resistivity (about 15 Ω.cm). The nucleation-limited conversion is strongly dependent upon polysilicon width. The resistance of $TiSi_2$-clad polysilicon increases dramatically as the poly linewidth is scaled down below 0.5 μm. Further, the sidewall of the polysilicon gate is surrounded and concealed by a spacer, and thus the polysilicon on the sidewall cannot react with titanium to form $TiSi_2$ such that the $TiSi_2$ layer formed on top of gate incurs edge thinning, as shown in FIG. 2A. FIG. 2A illustrates schematically the phenomenon of edge thinning, wherein numeral 70 is a gate, numeral 71 is $TiSi_2$ layer, numeral 72 is spacer, and numeral 73 shows the edge thinning of $TiSi_2$ layer. As the gate is further scaled down as shown in FIG. 2B, the proportion of edge thinning to $TiSi_2$-clad polysilicon is increased and thus the edge thinning influences the resistivity of $TiSi_2$-clad polysilicon more severely, and the resistivity dramatically increases.

In addition, there is parasitic capacitors between the polysilicon gate and drain/source, wherein the spacer is one dielectric of the parasitic capacitors. While scaling down the devices, the thickness of the spacer is scaled down too, and the parasitic capacitance is increased, such that the operation rate is slowed down due to the large parasitic capacitance.

SUMMARY OF THE INVENTION

Accordingly, an objective of the present invention is to provide a method for forming a gate-side air-gap structure in the salicide process to overcome bridging. The bridging between gate and drain/source in salicide process can be prevented by applying the gate-side air-gap structure according to the present invention.

Another objective of the present invention is to provide a gate-side air-gap structure to mitigate the edge thinning of $TiSi_2$ layer such that the resistivity of the $TiSi_2$-clad polysilicon is not dramatically increased.

A further objective of the present invention is to provide a gate-side air-gap structure to reduce the parasitic capacitance between gate and drain/source and thus improve the operating speed of the device.

According to the present invention, a method for forming a gate-side air-gap structure in the salicide process, which starts on a semiconductor wafer with active region defined completely by field oxide, includes the steps:

depositing sequentially a thin oxide layer, a polysilicon layer, and a first layer over said wafer;

patterning said first layer, said polysilicon layer, and said thin oxide layer to form a stack gate which consists of a first layer and a gate , wherein said gate consists of said polysilicon layer and said thin oxide layer;

forming lightly-doped drains beside said stack gate in said active region;

forming a second layer on said the sidewall of said stack gate;

forming a spacer on the sidewall of said second layer;

forming source and drain regions;

removing said first layer and said second layer to reveal said gate;

depositing a titanium layer over said wafer;

heating said titanium layer to form TiSi$_2$ layers on said gate, said drain region, and said source region;

removing said titanium layer remaining intact over said spacer and said field oxide; and heating said TiSi$_2$ over said wafer.

Referring to FIG. 3, a gate-side air-gap structure according to the present invention consists of: a polysilicon gate 80; a TiSi$_2$ layer 81 formed on the surface and the upper sidewall of said gate 80; and spacer 82 formed beside said gate 80, wherein an air gap exists between said gate 80 and said spacer 82.

The steps, advantages, and features of the present invention are further described as follows by an embodiment accompanying the drawings.

DETAILED DESCRIPTION OF THE INVENTION

FIGS. 4A through 4E, illustrate, in cross section, the process of the preferred embodiment according to the present invention. The process is described as follows.

Figure 4A:
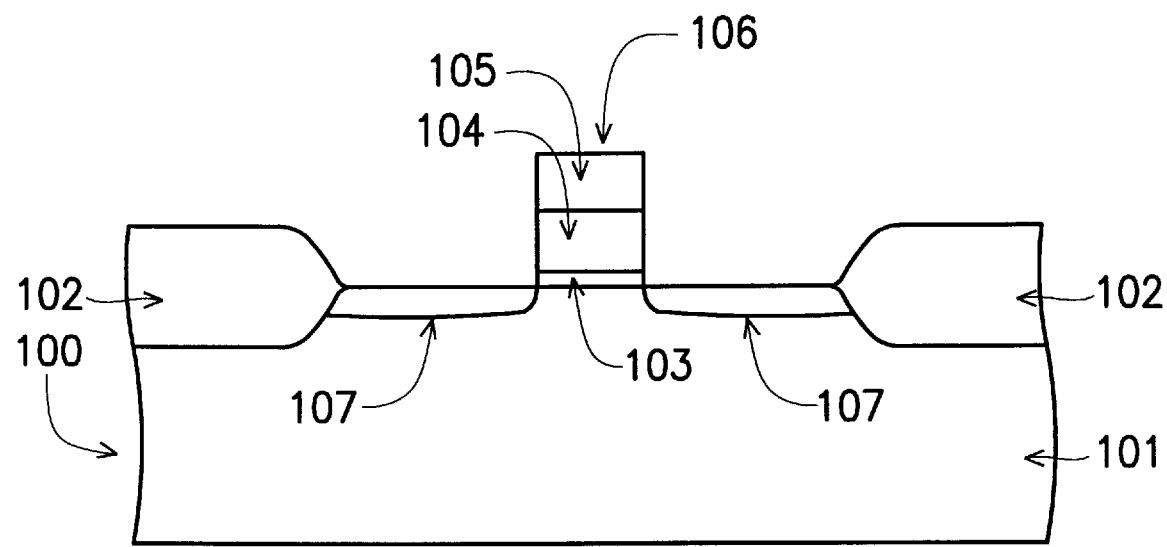
FIGS. 4A through 4E illustrate, in cross section, the process of the preferred embodiment according to the present invention.

First, field oxide 102 is formed on a substrate 101 of a semiconductor wafer 100. The active region on substrate 101 is defined by field oxide 102. A thin oxide layer 103, a polysilicon layer 104 of thickness about 2000 Å, and a Si$_3$N$_4$ layer 105 of thickness about 1000 Å are deposited sequentially on the wafer 100. The Si$_3$N$_4$ layer, polysilicon layer, and thin oxide layer are patterned and then etched anisotropically to form a stack gate 106, and then lightly doped drain (LDD) 107 is formed beside the stack gate 106 by ion implantation. The result is shown in FIG. 4A.

Figure 4B:
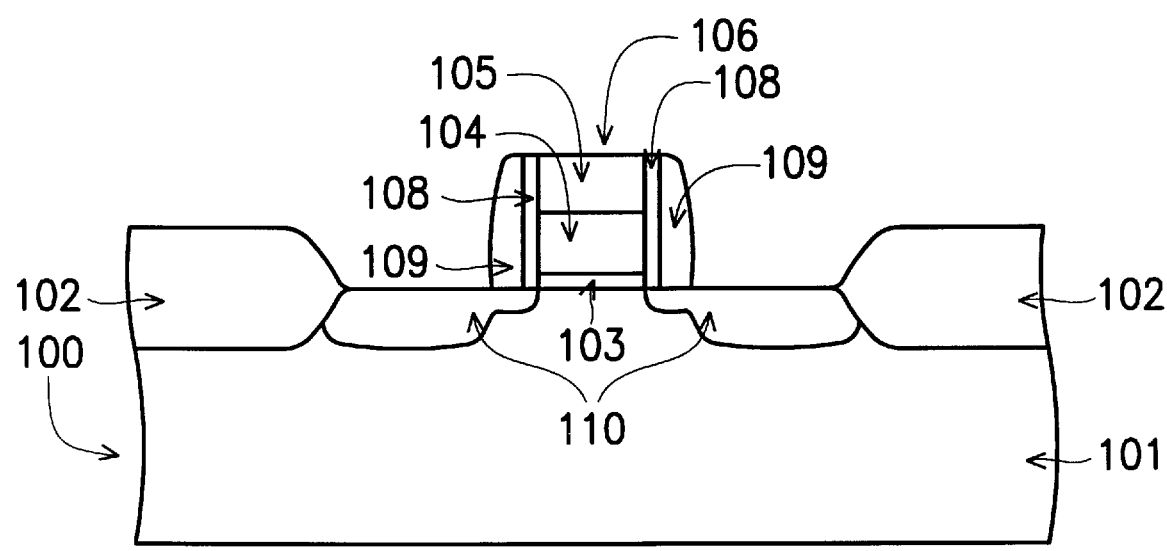

Second, the a Si$_3$N$_4$ layer 108 of thickness about 300 Å is deposited over the wafer 100, and then the Si$_3$N$_4$ layer 108 is etched anisotropically such that only the Si$_3$N$_4$ layer 108 of a thickness less than 300 Å remains on the sidewall of the stack gate 106. An oxide layer, such as a TEOS layer, of 1200 Å in thickness is deposited over the wafer 100, and then the oxide layer is etched anisotropically such that only the oxide layer of a thickness less than 1200 Å remains on the sidewall of the Si$_3$N$_4$ layer 108, and acts as spacer 109. The drain/source regions 110 are formed by ion implantation. The result is shown in FIG. 4B.

Figure 4C:
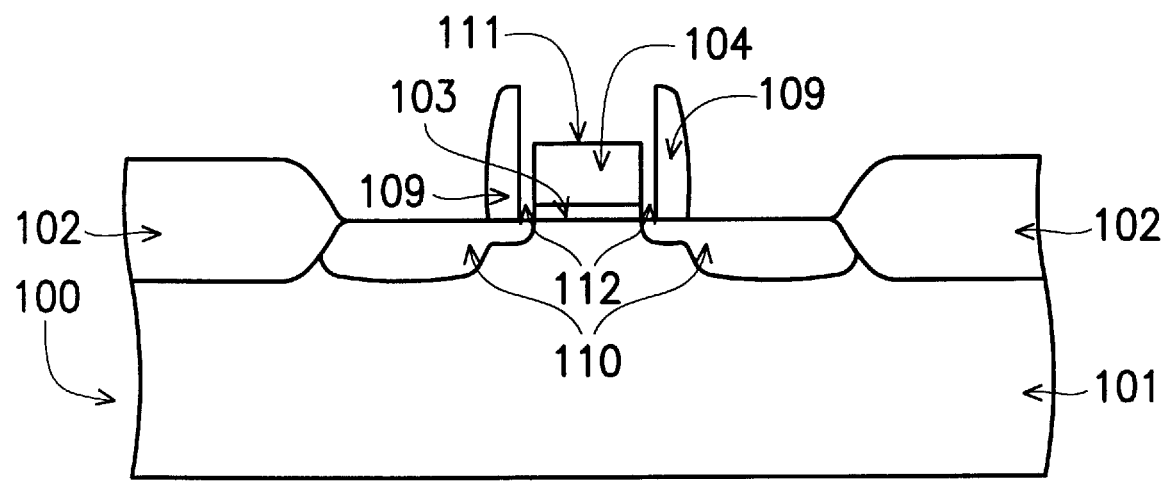
Figure 4D:
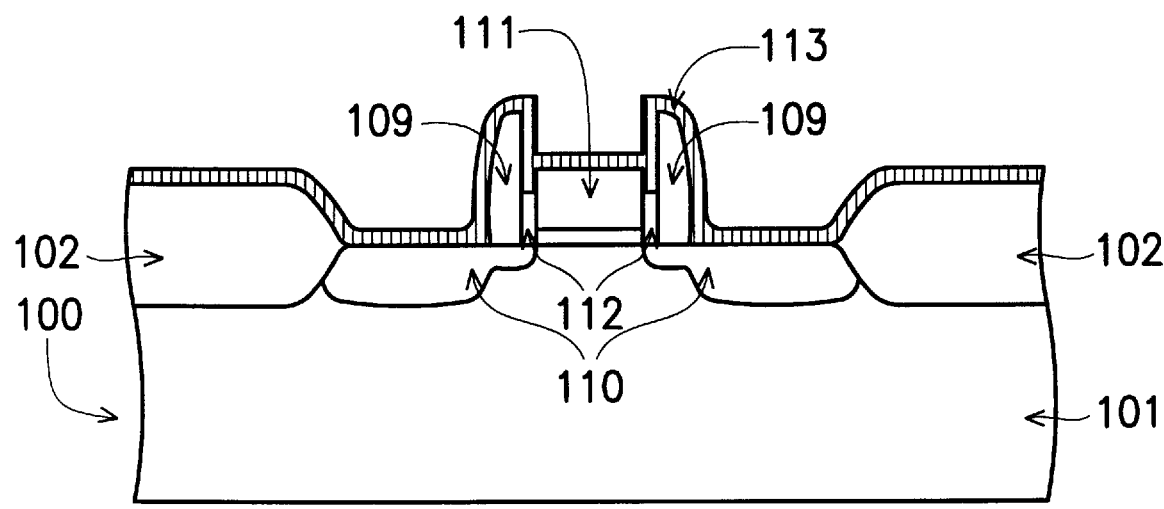

Next, Si$_3$N$_4$ layer 105 over polysilicon layer 104 and Si$_3$N$_4$ layer 108 between stack gate 106 and spacer 109 are removed by H$_3$PO$_4$ wet etching or dry etching. The result is illustrated in FIG. 4C, wherein gate 111 consists of thin oxide layer 103 and polysilicon layer 104, and there is air gap 112 between gate 111 and spacer 109. Referring to FIG. 4D, a titanium layer 113 is deposited over wafer 100, wherein the top surface and the upper sidewall of the polysilicon layer 104 are covered with titanium layer 113.

Then, the first rapid thermal process, RTP, is done at between 650° and 700° C. and with a nitrogen gas (N$_2$) ambient. During the annealing step, titanium layer 113 reacts with the polysilicon on the gate 111 and the crystalline silicon of the drain/source regions 110, and forms TiSi$_2$(C-49 phase) layers, however, the titanium over the spacer 109 and the field oxide 102, and air gap 112 remain intact.

Next, a mixture of NH$_4$OH, H$_2$O$_2$, and H$_2$O are used as the etchant to selectively wet etch the intact titanium layer. The wet etching dissolves the intact titanium layer but does not attack the TiSi$_2$ layers. All the titanium layers 113 over air gap 112, field oxide 102, and spacer 109 are removed, while the TiSi$_2$ layers are still left on the gate 111 and the source/drain regions 110.

Figure 4E:
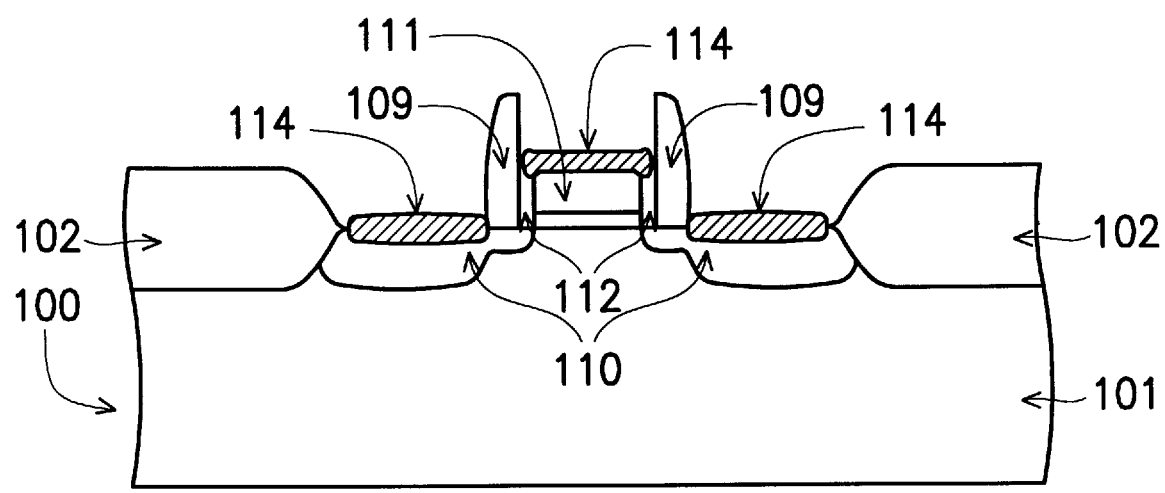

Then, the second RTP is done at 800° C., at a pressure of 760 mtorr and with a nitrogen gas (N$_2$) ambient. During the annealing step, the TiSi$_2$ layers of C-49 phase (with a high resistivity of about 60 $\mu\Omega$.cm) are transformed to the TiSi$_2$ layers 114 of C-54 phase (with a low resistivity of about 15 $\mu\Omega$.cm), as FIG. 4E illustrates. The method for forming a gate-side air-gap structure in the salicide process is completed.

The gate-side air-gap structure according to the method described above is illustrated in FIG. 3.

Figure 1A:
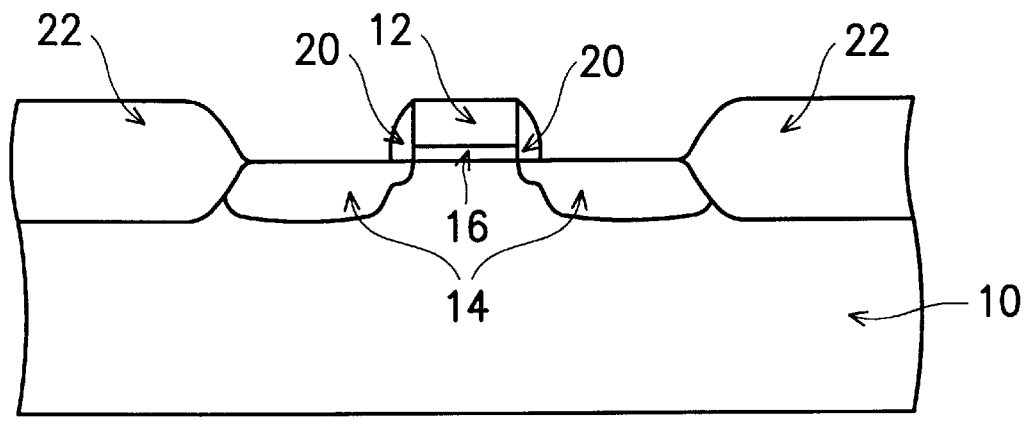
FIGS. 1A through 1E illustrate, in cross section, the process steps according to the prior art.
Figure 1B:
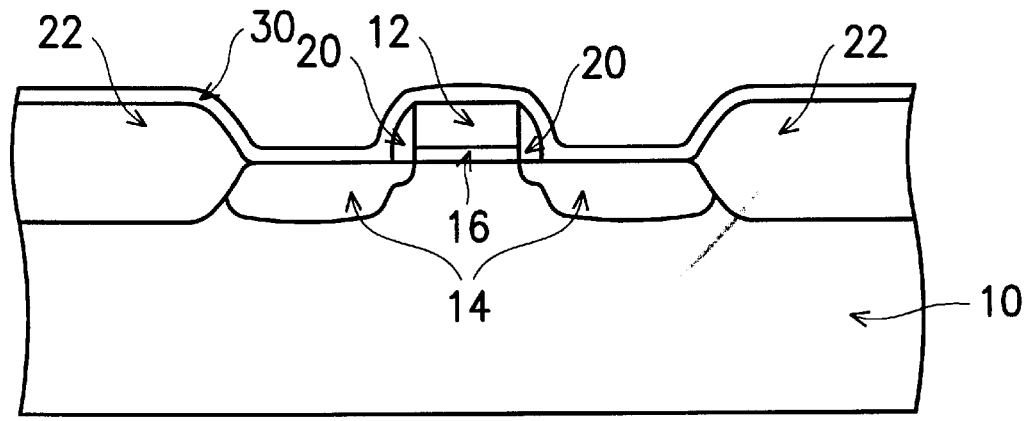
Figure 1C:
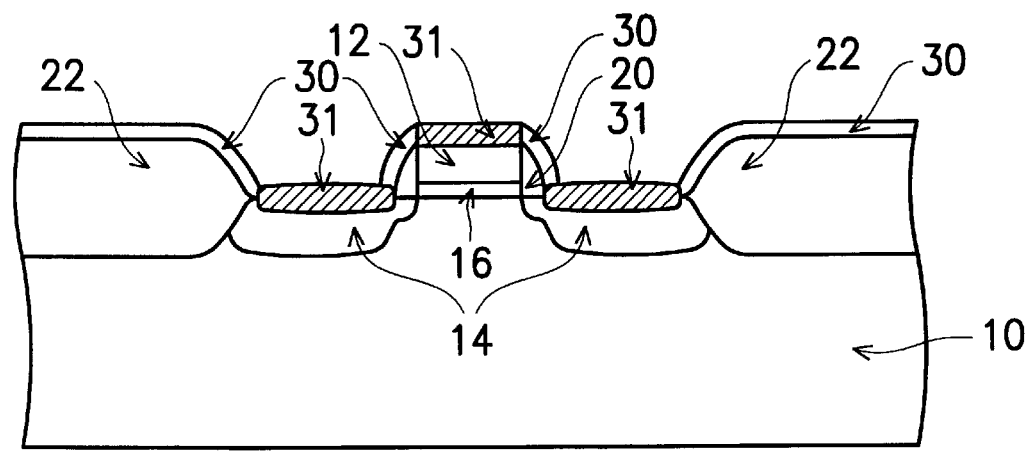
Figure 1D:
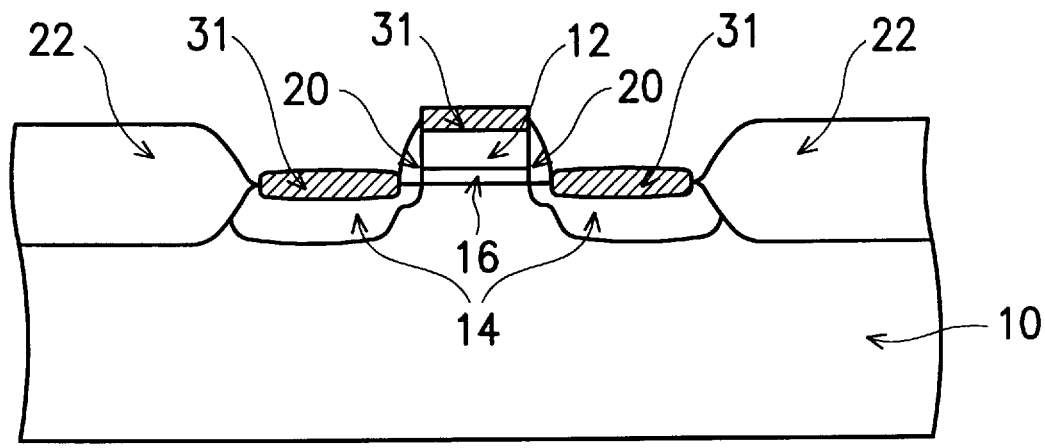
Figure 1E:
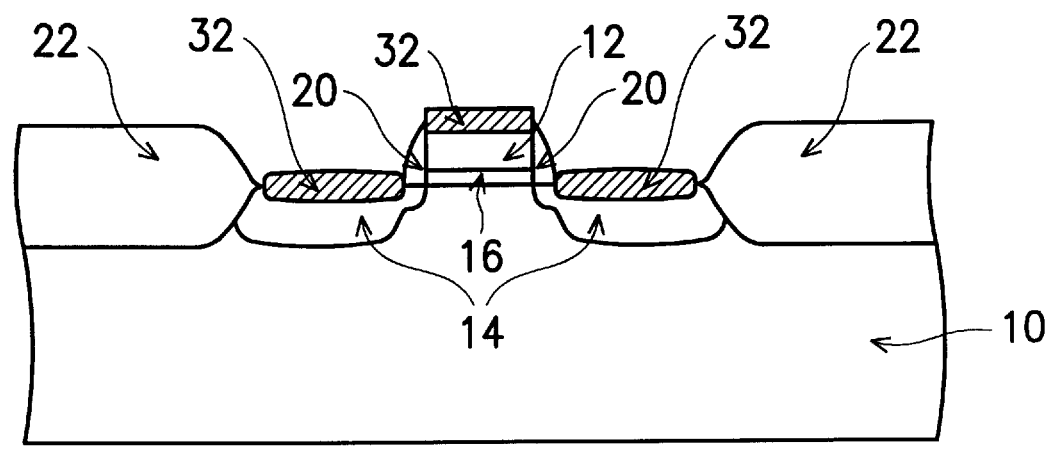
Figure 2A:
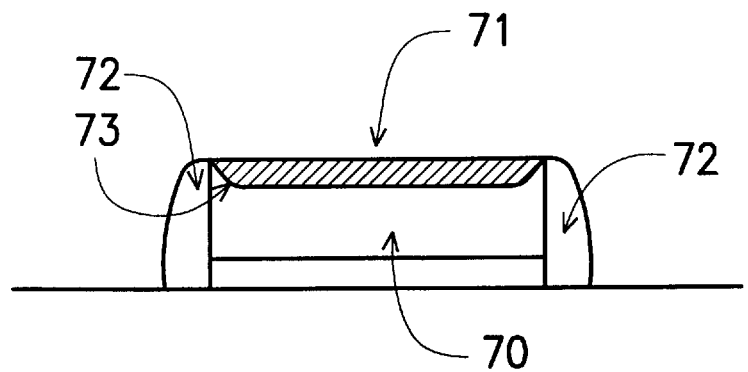
FIG. 2A through FIG. 2B illustrate, in cross section, the edge thinning phenomenon of TiSi$_2$ layer.
Figure 2B:
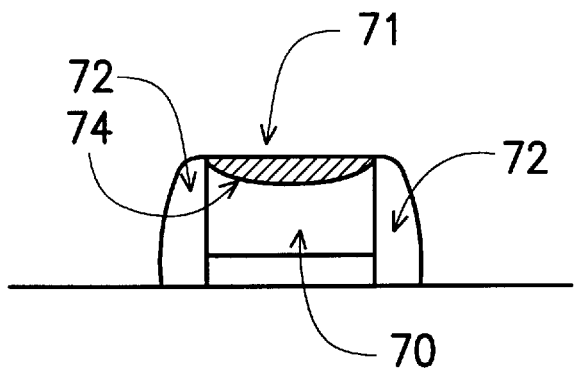
Figure 3:
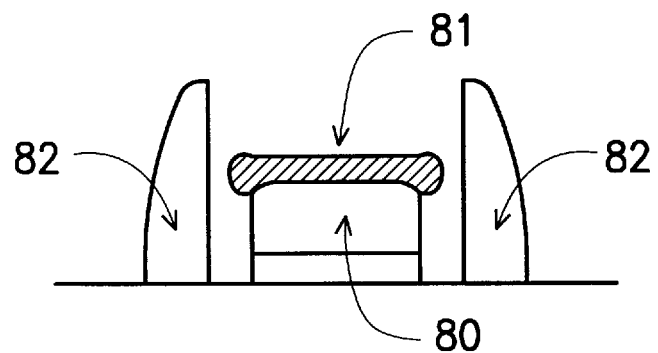
FIG. 3 illustrates, in cross section, the gate-side air-gap structure according the present invention.

Referring to FIG. 3, a gate-side air-gap structure consists of: a polysilicon gate 80; a TiSi$_2$ layer 81 formed on the surface and the upper sidewall of the gate 80; and spacer 82 formed around said gate 80, wherein an air gap exists between said gate 80 and said spacer 82. Such a gate-side air-gap structure has the following advantages:

1. Based on the embodiment described above, there is an air gap between the gate 111 and spacer 109, so the silicon diffusion length between gate 111 and drain/source region 110 is about 1300 Å, which is larger than that of the prior gate structure without an air-gap on the gate side. Therefore during first RTP, the probability for the silicon to diffuse across the spacer is reduced, and bridging (or a short circuit) between the gate and drain/source regions is prevented.

2. Because of the air gap, titanium layer can be deposited not only on the surface but also the upper sidewall of the polysilicon gate, and thus during RTP TiSi$_2$ layers can be formed on the surface and the upper sidewall of the polysilicon gate such that the edge thinning is reduced and the resistance of the TiSi$_2$-clad polysilicon will not be dramatically increased.

3. The air gap between gate and drain/source region can reduce the equivalent dielectric constant, and thus the parasitic capacitance between gate and drain/source is reduced such that the device operating speed is improved.

While the invention has been described in term of what are presently considered to be the most practical and preferred embodiment, it is to be understood that the invention need not to be limited to the disclosed embodiment. On the contrary, it is intended to cover various modifications and similar arrangements included within the spirit and scope of the appended claims, the scope of which should be accorded the broadest interpretation so as to encompass all such modifications and similar methods and structures.

What is claimed is:

1. A method for forming a gate-side air-gap structure in the salicide process, which starts on a semiconductor wafer with active region defined completely by field oxide, includes the steps of:

depositing sequentially a thin oxide layer, a polysilicon layer, and a first layer over said wafer;

patterning said first layer, said polysilicon layer, and said thin oxide layer to form a stack gate which consists of first layer and a gate, wherein said gate consists of said polysilicon layer and said thin oxide layer;

forming lightly-doped drains beside said stack gate in said active region;

forming a second layer on the sidewall of said stack gate;

forming spacer on the sidewall of said second layer;

forming source and drain regions;

removing said first layer and said second layer to reveal said gate, wherein air gaps exist between said gate and said spacer;

depositing a titanium layer over said wafer;

heating said titanium layer to form $TiSi_2$ layers on said gate, said drain region, and said source region;

removing said titanium layer remaining intact over said air gaps, said spacer, and said field oxide; and heating said $TiSi_2$ layer over said wafer.

2. The method as in claim 1, wherein said first layer is a $Si_3N_4$ layer.

3. The method as in claim 1, wherein said second layer is a $Si_3N_4$ layer.

4. The method as in claim 3, wherein said $Si_3N_4$ layer is removed by wet etching and $H_3PO_4$ solution is used as etchant.

5. The method as in claim 3, wherein said $Si_3N_4$ layer is removed by dry etching.

6. The method as in claim 1, wherein the forming of said second layer includes the steps of:

depositing said second layer over said wafer;

anisotropically etching said second layer such that said second layer merely remains on the sidewall of said stack gate.

7. The method as in claim 4, wherein the thickness of said depositing second layer is between 300 and 500 Å, and the width of said remaining second layer on said sidewall of said stack gate is between 300 and 500 Å.

8. The method as in claim 1, wherein the heating of said titanium layer is performed by means of a rapid thermal process at between 650° and 700° C. with nitrogen gas ($N_2$) ambient to form said $TiSi_2$ layers on said gate, said drain region, and said source region.

9. The method as in claim 1, wherein the heating of said $TiSi_2$ layer is performed by means of a rapid thermal process at between 800° and 850° C. with nitrogen gas ($N_2$) ambient.

\* \* \* \* \*